United States Patent
Qin et al.

(10) Patent No.: US 8,848,395 B2
(45) Date of Patent: Sep. 30, 2014

(54) SECURING MECHANISM AND ELECTRONIC DEVICE WITH CONNECTOR COVER

(75) Inventors: Xiao-Hui Qin, Shenzhen (CN); Chih-Chieh Huang, New Taipei (TW); Cheng-Yi Chao, New Taipei (TW); Chung-Yuan Chen, New Taipei (TW); Zuo-Dong Li, Shenzhen (CN); Shi-Yong Huang, Shenzhen (CN); Xue-Deng Pan, Shenzhen (CN); Yong-Hua Wang, Shenzhen (CN); Zhen-Cun Lu, Shenzhen (CN); Jian-Feng Fan, Shenzhen (CN); Huan Ren, Shenzhen (CN); Zheng-Wei Liu, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 161 days.

(21) Appl. No.: 13/535,500

(22) Filed: Jun. 28, 2012

(65) Prior Publication Data

US 2013/0128482 A1   May 23, 2013

(30) Foreign Application Priority Data

Nov. 21, 2011   (CN) .......................... 2011 1 0370581

(51) Int. Cl.
*H05K 9/00* (2006.01)
*H05K 1/18* (2006.01)
*H05K 7/12* (2006.01)

(52) U.S. Cl.
CPC ................ *H05K 7/12* (2013.01); *H05K 9/0026* (2013.01)

USPC .......................................... 361/818; 361/764

(58) Field of Classification Search
CPC ............... H01L 23/552; H05K 1/0218; H01R 13/6594; H01R 23/7073; H01R 4/64
See application file for complete search history.

(56) References Cited

U.S. PATENT DOCUMENTS

| | | | |
|---|---|---|---|
| 3,721,746 A * | 3/1973 | Knappenberger ............. | 174/372 |
| 5,418,329 A * | 5/1995 | Katoh et al. ................... | 174/541 |
| 5,563,770 A * | 10/1996 | Bethurum ...................... | 361/737 |
| 5,637,014 A * | 6/1997 | Sukegawa et al. .......... | 439/607.4 |
| 5,844,784 A * | 12/1998 | Moran et al. ................... | 361/818 |
| 6,178,097 B1 * | 1/2001 | Hauk, Jr. ........................ | 361/816 |
| 6,729,905 B1 * | 5/2004 | Hwang ..................... | 439/607.21 |
| 6,744,640 B2 * | 6/2004 | Reis et al. ...................... | 361/818 |
| 6,773,275 B1 * | 8/2004 | Chen ............................... | 439/92 |
| 7,090,513 B2 * | 8/2006 | Kuo ................................ | 439/92 |
| 7,175,443 B2 * | 2/2007 | Mizuno et al. ................ | 439/76.1 |

(Continued)

*Primary Examiner* — Hoa C Nguyen
*Assistant Examiner* — Xantha C Cunningham
(74) *Attorney, Agent, or Firm* — Novak Druce Connolly Bove + Quigg LLP

(57) ABSTRACT

An electronic device includes a printed circuit board (PCB), at least one socket mounted to the PCB, at least one connector inserted into the at least one socket, a first member mounted to the PCB, a second member mounted to the PCB, and a first cover. The first cover covers and presses against the at least one connector, the first cover includes a first end for being fixed to the first member and a second end opposite to the first end for being fixed to the second member. At least one of the first member and the second member is soldered to the PCB, and a soldered area of the at least one of the first member and the second member is larger than a predetermined value.

15 Claims, 8 Drawing Sheets

(56) References Cited

U.S. PATENT DOCUMENTS

| | | | |
|---|---|---|---|
| 7,351,105 B2* | 4/2008 | Delaney et al. | 439/607.36 |
| 7,390,207 B2 | 6/2008 | Noguchi et al. | |
| 7,452,219 B2* | 11/2008 | Kitajima et al. | 439/92 |
| 7,504,592 B1* | 3/2009 | Crotty, Jr. | 174/372 |
| 7,663,895 B2* | 2/2010 | Huang | 361/818 |
| 7,708,600 B2* | 5/2010 | Wu | 439/660 |
| 7,833,025 B2* | 11/2010 | Voli et al. | 439/76.1 |
| 7,901,221 B1* | 3/2011 | Li et al. | 439/95 |
| 7,986,533 B2* | 7/2011 | Ren et al. | 361/818 |
| 2002/0185294 A1* | 12/2002 | Shlyakhtichman et al. | 174/52.1 |
| 2003/0128534 A1* | 7/2003 | Otani et al. | 361/816 |
| 2005/0231932 A1* | 10/2005 | Nestor et al. | 361/818 |
| 2005/0272291 A1* | 12/2005 | Chang | 439/159 |
| 2006/0283630 A1* | 12/2006 | Kiiskinen et al. | 174/377 |
| 2007/0235221 A1* | 10/2007 | Chang | 174/382 |
| 2008/0296058 A1* | 12/2008 | Kamada et al. | 174/377 |
| 2009/0159329 A1* | 6/2009 | Krohn et al. | 174/377 |
| 2009/0161321 A1* | 6/2009 | Sun et al. | 361/719 |
| 2009/0181563 A1* | 7/2009 | Lin et al. | 439/92 |
| 2009/0266603 A1* | 10/2009 | Kao | 174/377 |
| 2009/0273912 A1* | 11/2009 | Myers et al. | 361/818 |
| 2009/0308653 A1* | 12/2009 | Wu | 174/377 |
| 2010/0084180 A1* | 4/2010 | Chiang et al. | 174/377 |
| 2010/0085719 A1* | 4/2010 | Lu et al. | 361/782 |
| 2010/0246143 A1* | 9/2010 | Dinh et al. | 361/748 |
| 2011/0073360 A1* | 3/2011 | Su | 174/377 |
| 2011/0085317 A1* | 4/2011 | Nagata et al. | 361/818 |
| 2011/0094791 A1* | 4/2011 | Kim et al. | 174/377 |
| 2011/0159711 A1* | 6/2011 | Niitsu et al. | 439/67 |

* cited by examiner

SECURING MECHANISM AND ELECTRONIC DEVICE WITH CONNECTOR COVER

BACKGROUND

1. Technical Field

The disclosed embodiments relate to a securing mechanism and an electronic device with a cover to secure connectors in place.

2. Description of Related Art

Electronic devices, such as mobile phones, include a printed circuit board (PCB), sockets mounted to the PCB; and connectors respectively inserted into the sockets. In order to prevent the connectors from dropping off the sockets, a cover is fixed to the PCB over the connectors with screws, so that the cover applies a pressing force to the connectors.

Fixing columns are soldered to the PCB, the screws fasten to the fixing columns. However, the soldered area of each of the fixing columns is small, therefore, the fixing column can become loose from the PCB due to vibration, causing the connector to drop off the corresponding socket.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the eight views.

DETAILED DESCRIPTION

Figure 1:
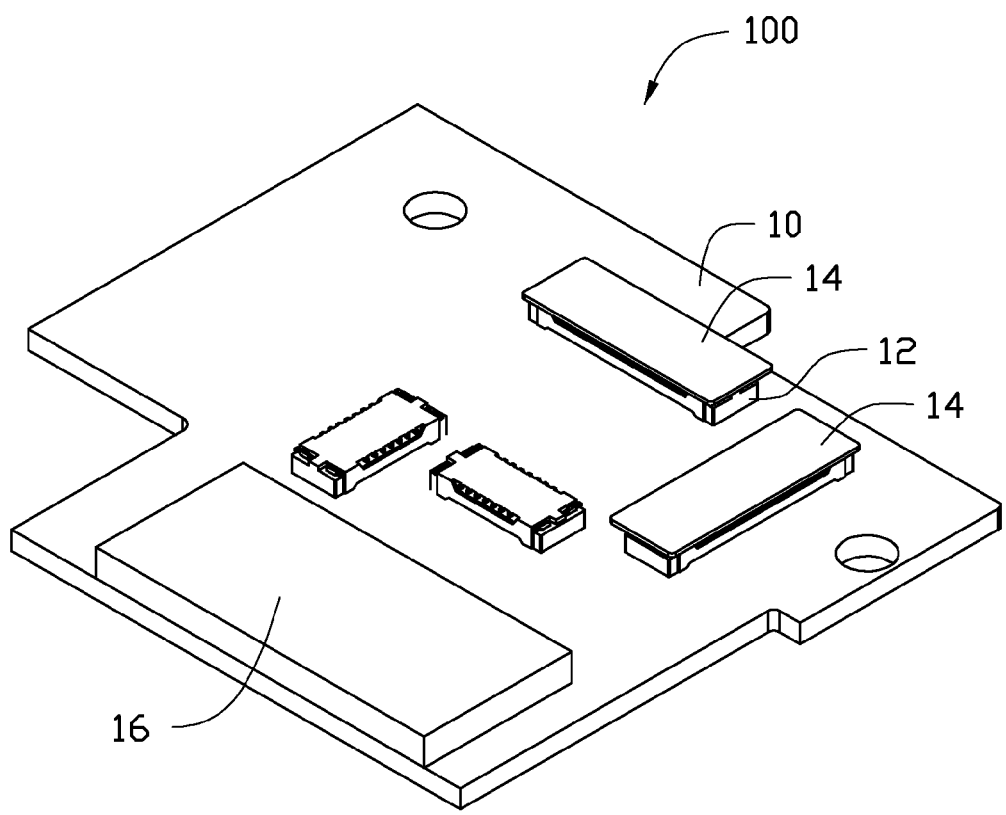
FIG. 1 is a schematic diagram showing a first portion of an electronic device in accordance with one embodiment.
Figure 2:
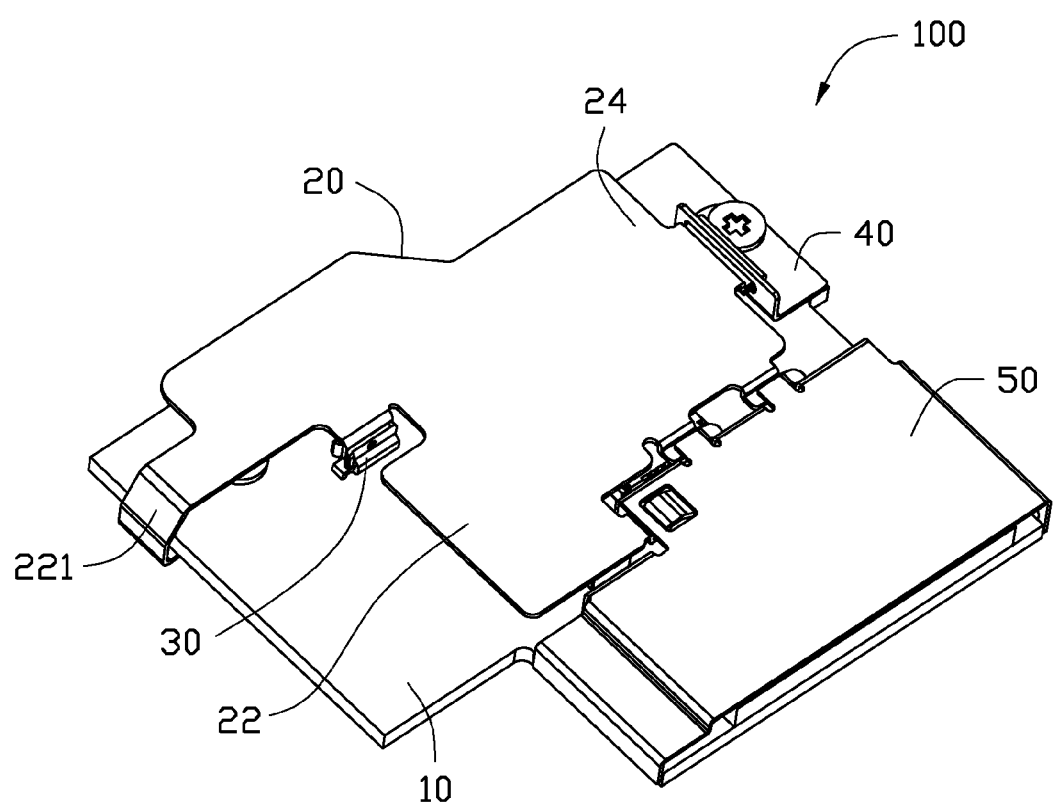
FIG. 2 is an isometric diagram of the electronic device including the first portion of FIG. 1 and a second potion, and the second potion is shown in accordance with a first embodiment.

Referring to FIGS. 1 and 2, a first embodiment of an electronic device 100 includes a printed circuit board (PCB) 10, a plurality of sockets 12, a plurality of connectors 14, an integrated circuit 16, a first cover 20, a first member 30, a second member 40, and a second cover 50. The PCB 10, the plurality of sockets 12, the plurality of connectors 14, and the integrated circuit 16 constitutes a first portion of the electronic device 100, and the first cover 20, the first member 30, the second member 40, and the second cover 50 constitutes a second portion of the electronic device 100.

The plurality of sockets 12, the integrated circuit 16, the first member 30, and the second member 40 are all mounted to the PCB 10. The plurality of connectors 14 are respectively inserted into the plurality of sockets 12. In other embodiments, the electronic device 100 includes one socket 12 and one connector 14 inserted into the socket 12.

A first end 22 and a second end 24 of the first cover 20 are fixed to the first member 30 and the second member 40 respectively, so as to cover and press down the plurality of connectors 14, the first end 22 is opposite to the second end 24. A first distal end and a second distal end of the second cover 50 are all soldered to the PCB 10, the second distal end of the second cover 50 is opposite to the first distal end of the second cover 50. The second cover 50 is used for covering the integrated circuit 16 and providing an electromagnetic interference (EMI) shield for the integrated circuit 16. The first member 30 and the second member 40 are soldered to the PCB 10, each of the soldered area of the first member 30 and the second member 40 is greater than a predetermined value. The second cover 50 engages with the first cover 20 and presses down on the first cover 20, therefore, the first cover 20 cannot drop off the PCB 10, and the plurality of connectors 14 are respectively and firmly held in the plurality of sockets 12. In this embodiment, the first member 30, the second member 40, the first cover 20 and the second cover 50 constitute a securing mechanism for securing the plurality of connectors 14 to the plurality of sockets 12.

Figure 3:
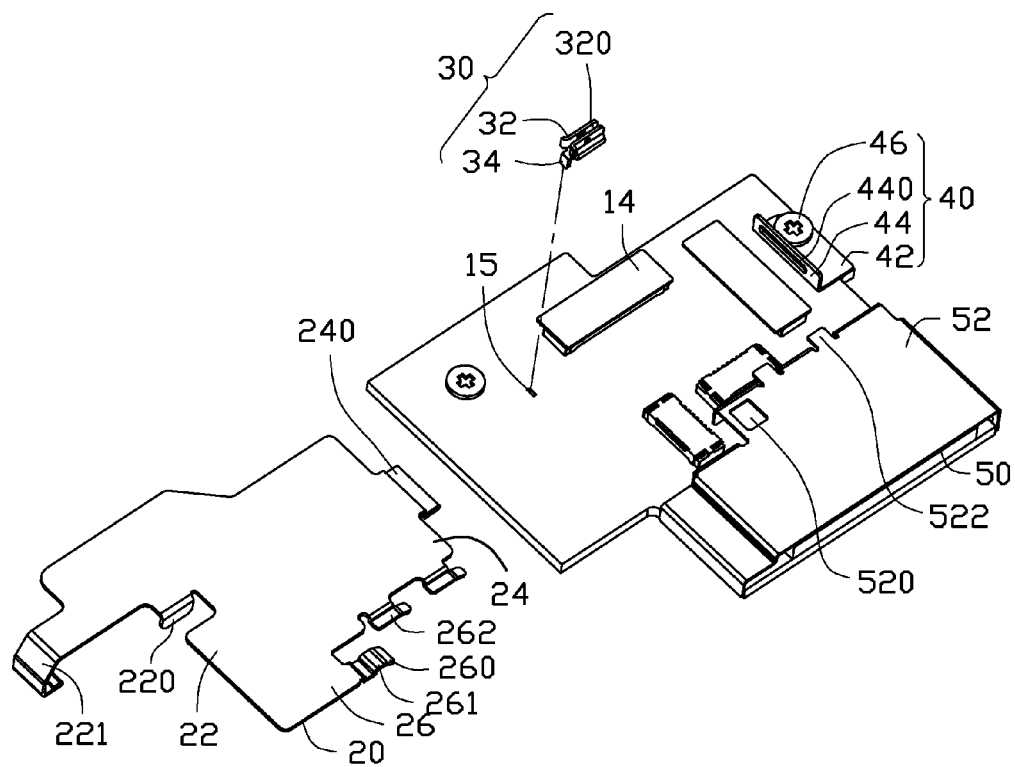
FIG. 3 is an exploded diagram of the electronic device of FIG. 2.

Referring to FIG. 3, the first cover 20 further includes a third end 26, and the first end 22 and the second end 24 are respectively connected to two opposite ends of the third end 26. A first protrusion portion 220 extends from the first end 22, a second protrusion portion 240 extends from the second end 24, a third protrusion portion 260 and two fourth protrusion portions 262 extend from the third end 26. In this embodiment, the first protrusion portion 220 extends downwards from the first end 22, the first protrusion portion 220 is perpendicular to the first end 22. The third protrusion portion 260 forms a first protrusion block 261. The first member 30 includes a first base portion 32 soldered to the PCB 10 and a first plate 34 extending from the first base portion 32, the first base portion 32 defines a groove 320. The first protrusion portion 220 is fixed in the groove 320; the PCB 10 defines a first hole 15, the first plate 34 is fixed in the first hole 15.

The second member 40 includes a base portion 42 soldered to the PCB 10 and a second plate 44 extending from the base portion 42, the second plate 44 defines a first opening 440, the second protrusion portion 240 is fixed in the first opening 440.

The second cover 50 includes a fifth end 52 adjacent to the third end 26 of the first cover 20. The fifth end 52 defines a second opening 520, and two fifth protrusion portions 522 extend from the fifth end 52, the first protrusion block 261 is fixed in the second opening 520, and each of the two fourth protrusion portions 262 is pressed by a fifth protrusion portions 522.

Figure 4:
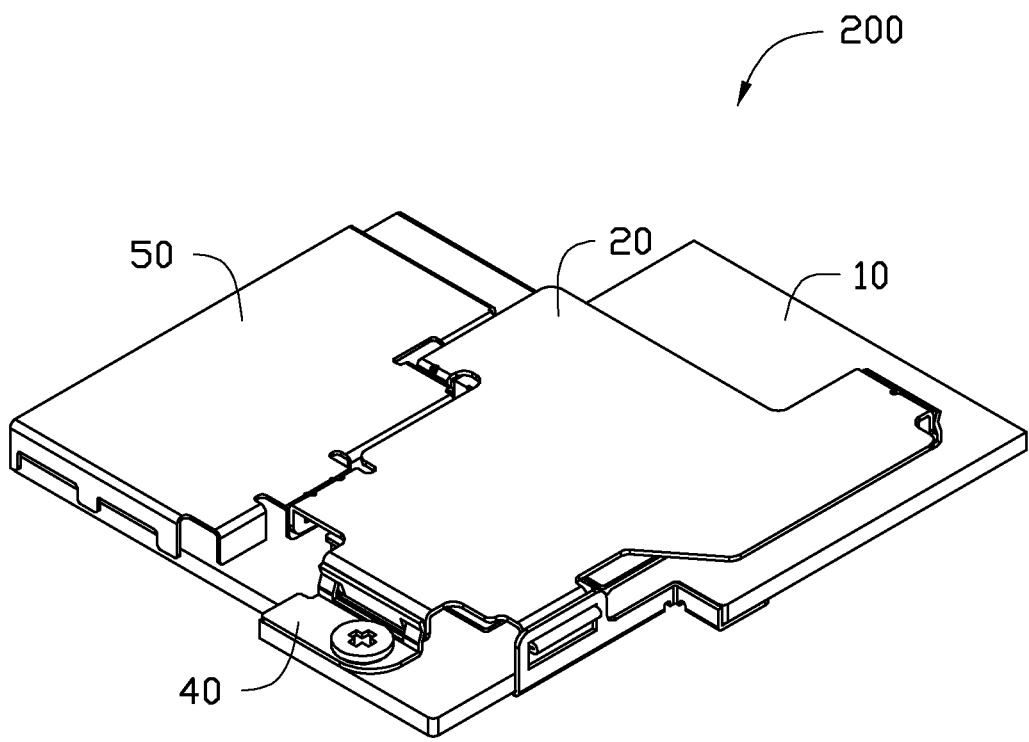
FIG. 4 is an isometric diagram of the electronic device including the first portion of FIG. 1 and a second potion, and the second potion is shown in accordance with a second embodiment.
Figure 5:
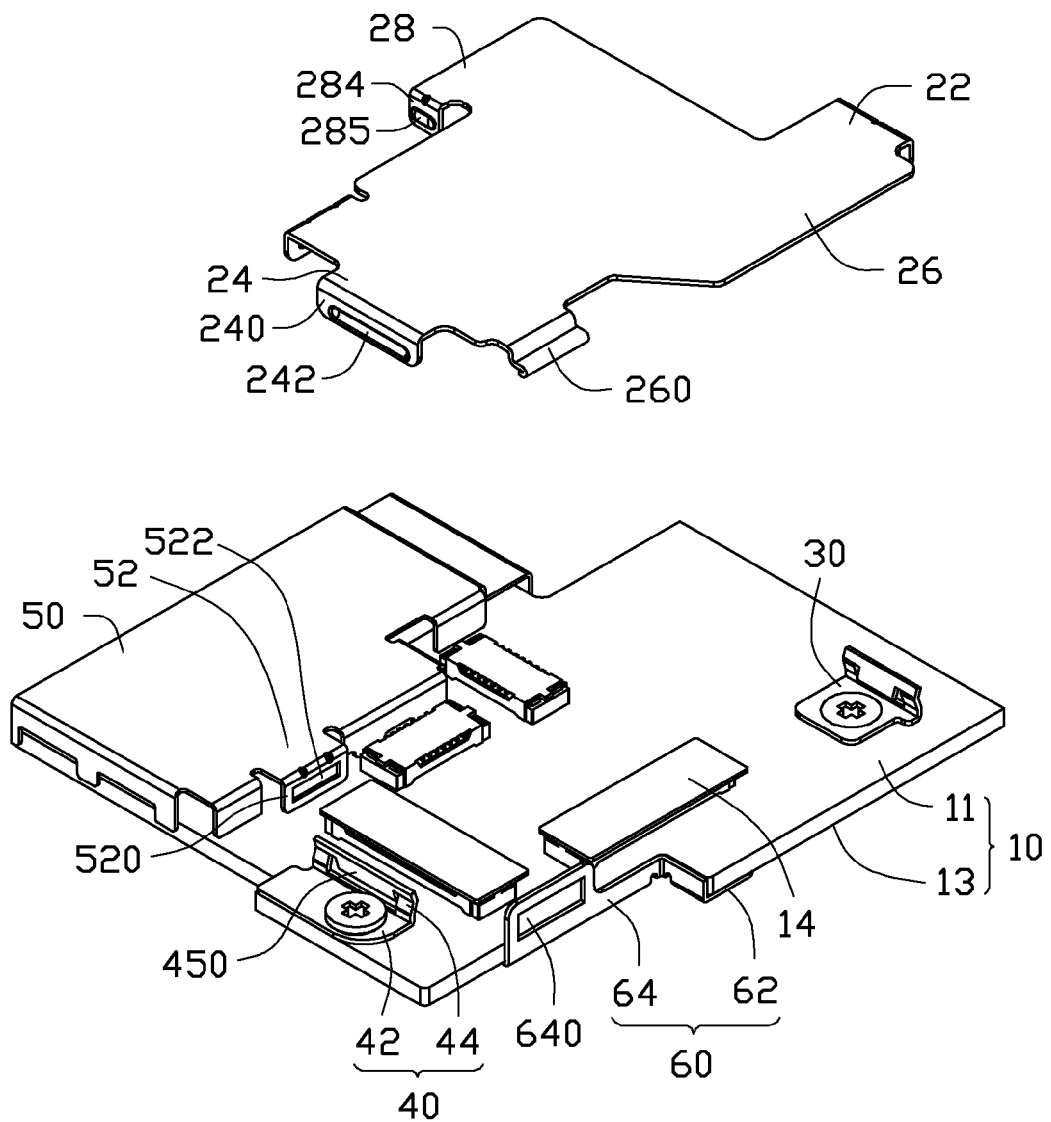
FIG. 5 is an exploded diagram of the electronic device of FIG. 4 viewed from a first direction.

Referring to FIGS. 4 and 5, a second embodiment of the electronic device 200 is shown, the differences between the electronic device 200 and the electronic device 100 is that the first cover 20, the second cover 50, the first member 30 and the second member 40 of the electronic device 200 are respectively different from the first cover 20, the second cover 50, the first member 30 and the second member 40 of the electronic device 100.

Figure 6:
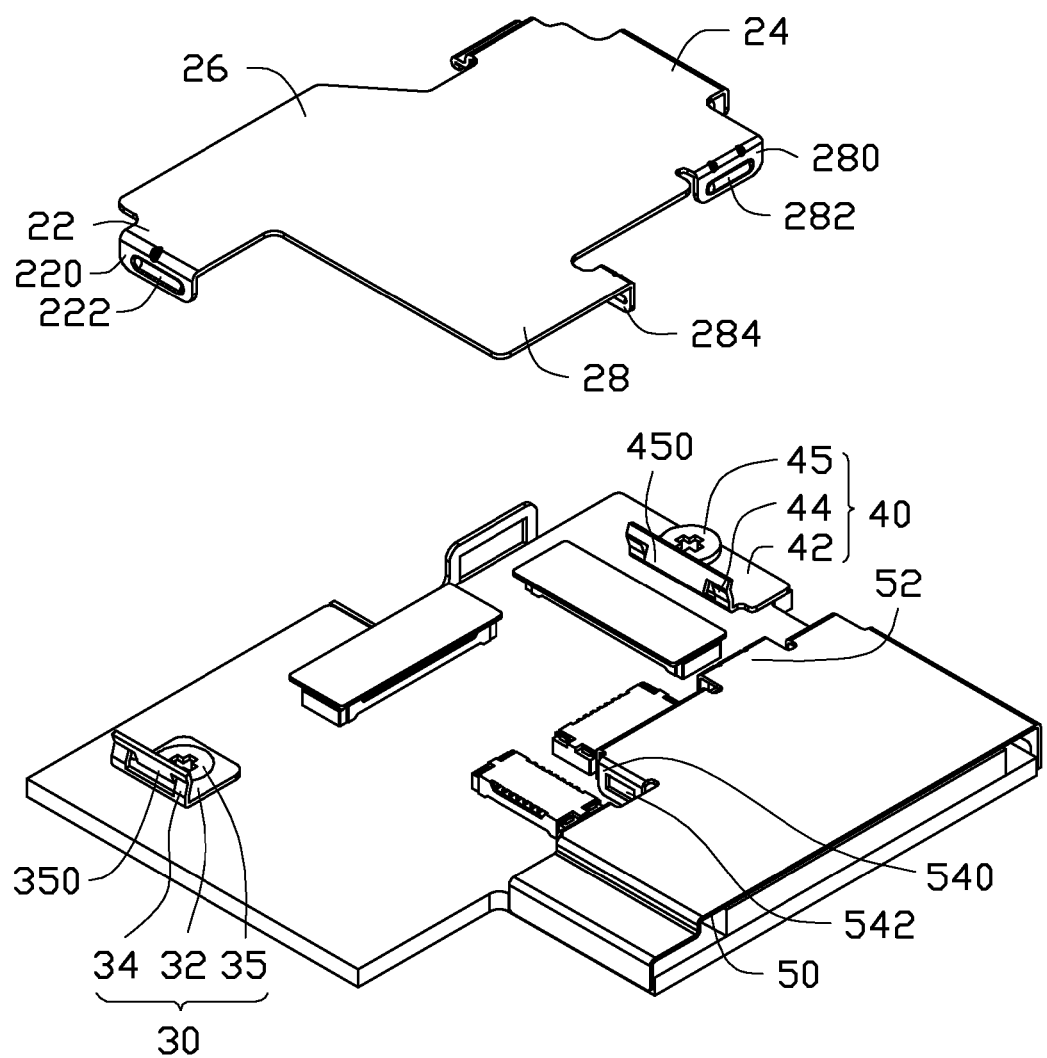
FIG. 6 is the exploded diagram of the electronic device of FIG. 4 viewed from a second direction.

Referring to FIG. 6, the first member 30 includes a first base portion 32 soldered to the PCB 10, a first plate 34 extending from the first base portion 32, and a screw 35, the first plate 34 forms a first protrusion block 350. A first protrusion portion 220 extends from the first end 22, the first protrusion portion 220 defines a first groove 222, the first protrusion block 350 is fixed in the first groove 222.

The second member 40 includes a base portion 42 soldered to the PCB 10, a second plate 44 extending from the base portion 42, and a screw 45. The second plate 44 forms a second protrusion block 450; a second protrusion portion 240 extends from the second end 24, the second protrusion portion 240 defines a second groove 242, the second protrusion block 450 is fixed in the second groove 242.

The electronic device 200 further includes a third member 60 mounted to the PCB 10, the PCB 10 includes a first surface 11 and a second surface 13 opposite to the first surface 11. The plurality of sockets 12, the integrated circuit 16, the first member 30, and the second member 40 are all mounted to the first surface 11. The first cover 20 further includes a third end 26 and a fourth end 28, the first end 22 and the second end 24 are at opposite ends of the third end 26. The fourth end 28 is opposite to the third end 26, the first end 22 and the second end 24 are also respectively connected to two opposite ends of the fourth end 28.

A third protrusion portion 260 extends from the third end 26, the third member 60 includes a third base portion 62 soldered to the second surface 13 of the PCB 10 and a third plate 64 extending from the third base portion 62, the third plate 64 defines a third opening 640, and the third protrusion portion 260 is fixed in the third opening 640.

A fourth protrusion portion 280 and a fifth protrusion portion 284 extend from the fourth end 28, the fourth protrusion portion 280 is perpendicular to the fifth protrusion portion 284, the fourth protrusion portion 280 forms a fourth protrusion block 282, and the fifth protrusion portion 284 forms a fifth protrusion block 285. A sixth protrusion portion 520 and a seventh protrusion portion 540 extend from the second cover 50, the sixth protrusion portion 520 defines a sixth opening 522, and the seventh protrusion portion 540 defines a seventh opening 542. The fourth protrusion block 282 is fixed in the sixth opening 522, and the fifth protrusion block 285 is fixed in the seventh opening 542.

The first base portion 32 of the first member 30 defines a first through hole (not shown), the base portion 42 of the second member 40 defines a second through hole (not shown). The first screw 35 is screwed into the PCB 10 via the first through hole, the second screw 45 is screwed into the PCB 10 via the second through hole.

Figure 7:
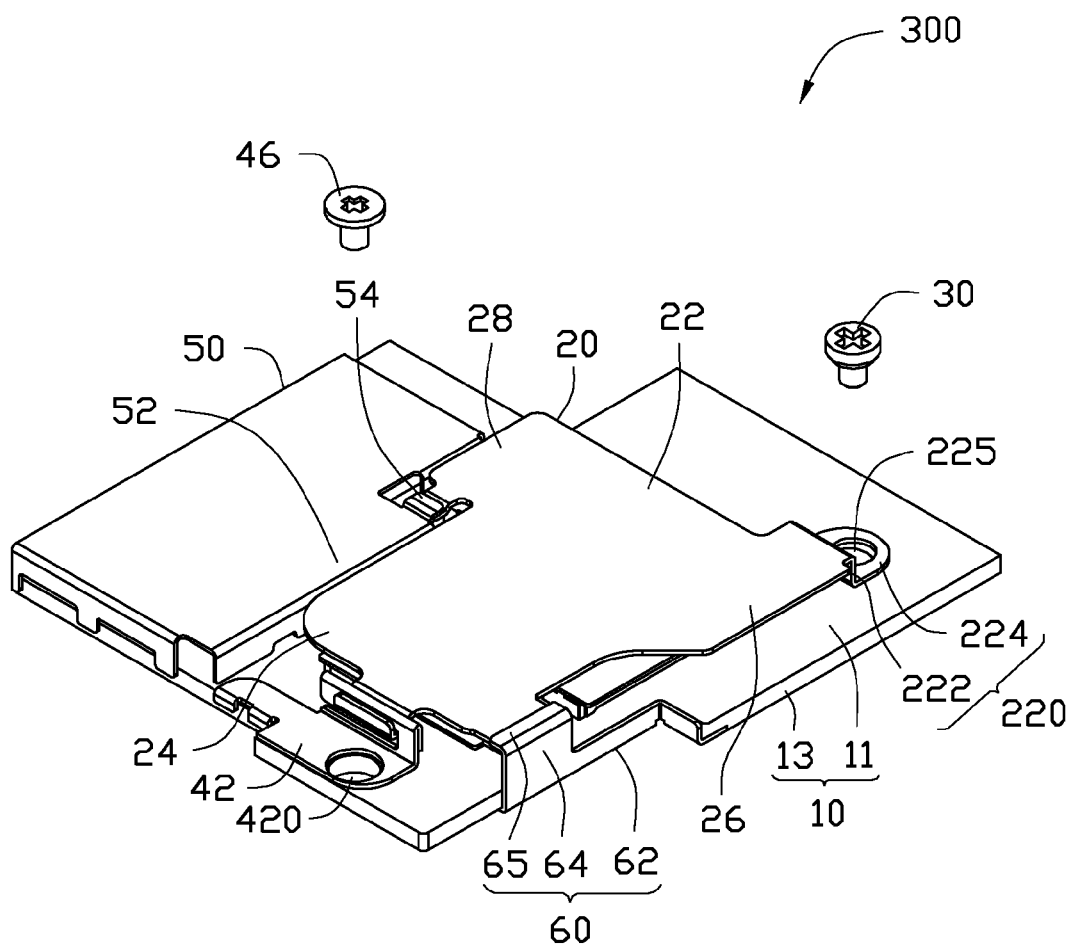
FIG. 7 is an isometric diagram of the electronic device including the first portion of FIG. 1 and a second potion, and the second potion is shown in accordance with a third embodiment.
Figure 8:
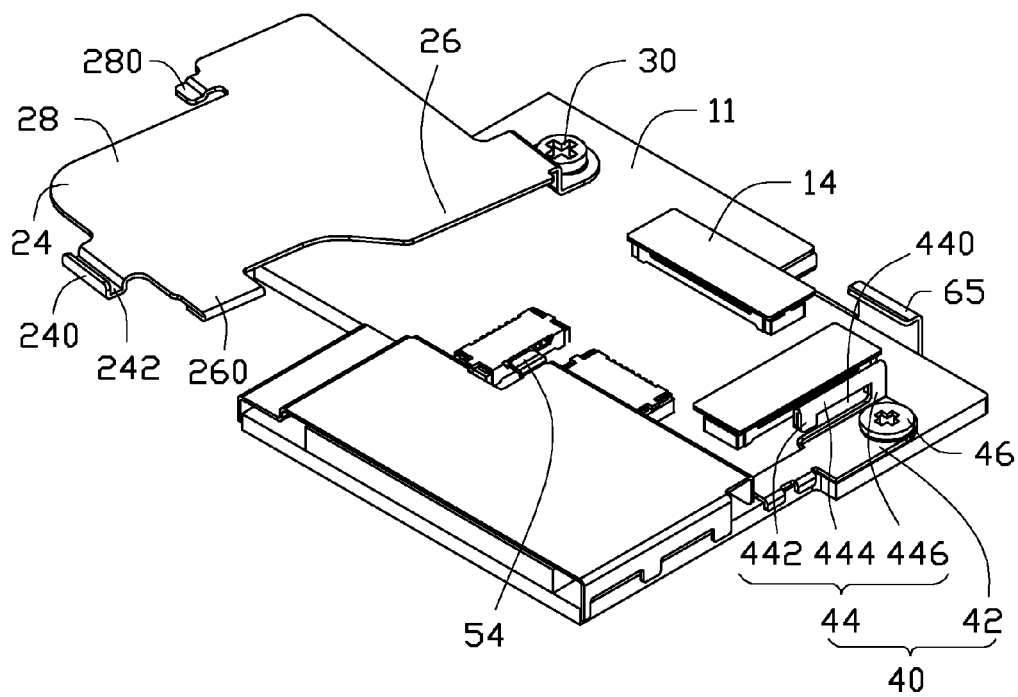
FIG. 8 is an exploded diagram of the electronic device of FIG. 7.

Referring to FIGS. 7 and 8, a third embodiment of the electronic device 300 is shown, the difference between the electronic device 300 and the electronic device 100 is that the first cover 20, the second cover 50, the first member 30 and the second member 40 of the electronic device 300 are respectively different from the first cover 20, the second cover 50, the first member 30 and the second member 40 of the electronic device 100.

A first protrusion portion 220 extends from the first end 22, the first protrusion portion 220 includes a first plate 224 and a first connecting plate 222, the first end 22 and the first plate 224 are respectively connected to two opposite ends of the first connecting plate 222. The first end 22 and the first plate 224 are respectively located in two opposite sides of the first connecting plate 222, the first plate 224 defines a first through hole 225. The first member 30 is mounted to the PCB 10 via the first through hole 225. In this embodiment, the first member 30 is a screw; the first end 22 and the first plate 224 are respectively and perpendicularly connected to two opposite ends of the first connecting plate 222.

The second member 40 includes a second base plate 42 soldered to the PCB 10, a second plate 44 extends from the second base plate 42, and a second screw 46. The second base plate 42 defines a second through hole 420, a second screw 46 is screwed into the PCB 10 via the second through hole 420. The second plate 44 defines a second opening 440, the second plate 44 includes a first side plate 442, a second side plate 446, and a second connecting plate 444, the first side plate 442 and the second side plate 446 are respectively connected to two opposite ends of the second connecting plate 444. The first side plate 442 and the second base plate 42 are separated by the second opening 440, the second connecting plate 444 and the second base plate 42 are respectively connected to two opposite ends of the second side plate 446.

A clamping portion 240 extends from the second end 24 and defines a groove 242, the clamping portion 240 is received in the second opening 440, and the second connecting plate 444 is clamped to the groove 242.

The first cover 20 further includes a third end 26 and a fourth end 28 opposite to the third end 26, the first end 22 and the second end 24 are respectively connected to two opposite ends of the third end 26, a third protrusion portion 260 extends from the third end 26. The first end 22 and the second end 24 are also respectively connected to two opposite ends of the fourth end 28, a fourth protrusion portion 280 extends from the fourth end 28.

The PCB 10 includes a first surface 11 and a second surface 13 opposite to the first surface 11. The plurality of sockets 12, the first member 30, the second member 40, and the integrated circuit 16 are all mounted to the first surface 11. The electronic device 300 further includes a third member 60. The third member 60 includes a third base portion 62 soldered to the second surface 13 of the PCB 10, a third connecting plate 64, and a first pressing plate 65. The third base portion 62 and the first pressing plate 65 are respectively connected to two opposite ends of the third connecting plate 64, the first pressing plate 65 is parallel to the third base portion 62, and the first pressing plate 65 presses against the third protrusion portion 260 of the first cover 20. A second pressing plate 54 extends from the second cover 50, the second pressing plate 54 presses against the fourth protrusion portion 280.

Alternative embodiments will become apparent to those skilled in the art without departing from the spirit and scope of what is claimed. Accordingly, the present disclosure should not be deemed to be limited to the above detailed description, but rather only by the claims that follow and the equivalents thereof.

What is claimed is:

1. An electronic device, comprising:
a printed circuit board (PCB);
at least one socket mounted to the PCB;
at least one connector inserted into the at least one socket;
a first member mounted to the PCB;
a second member mounted to the PCB; and
a first cover for covering and pressing against the at least one connector, the first cover comprising a first end for being fixed to the first member and a second end opposite to the first end for being fixed to the second member;
wherein at least one of the first member and the second member is soldered to the PCB, the first member comprises a first base portion soldered to the PCB and a first plate extending from the first base portion, the first plate forms a first protrusion block; a first protrusion portion extends from the first end, the first protrusion portion defines a first groove, and the first protrusion block is fixed in the first groove; the second member comprises a base portion soldered to the PCB and a second plate extending from the base portion, the second plate forms a second protrusion block; a second protrusion portion extends from the second end, the second protrusion portion defines a second groove, and the second protrusion block is fixed in the second groove.

2. The electronic device of claim 1, further comprising:
an integrated circuit mounted to the PCB; and
a second cover for covering the integrated circuit and providing an electro-magnetic interference (EMI) shield for the integrated circuit;
wherein a first distal end and a second distal end of the second cover are all soldered to the PCB, the second distal end is opposite to the first distal end; the second cover engages with the first cover and presses against the first cover.

3. The electronic device of claim 1, further comprising a third member mounted to the PCB, wherein the PCB comprises a first surface and a second surface opposite to the first surface, the at least one socket, the first member, and the second member are mounted to the first surface, the first cover further comprises a third end, the first end and the second end are respectively connected to two opposite ends of the third end, a third protrusion portion extends from the third end; the third member comprises a third base portion soldered to the second surface of the PCB and a third plate extends from the third base portion, the third plate defines a third opening, and the third protrusion portion is fixed in the third opening.

4. The electronic device of claim 3, wherein the first cover further comprises a fourth end opposite to the third end, the first end and the second end are respectively connected to two opposite ends of the fourth end, a fourth protrusion portion and a fifth protrusion portion extend from the fourth end, the fourth protrusion portion is perpendicular to the fifth protrusion portion, the fourth protrusion portion forms a fourth protrusion block, and the fifth protrusion portion forms a fifth protrusion block; and
a sixth protrusion portion and a seventh protrusion portion extend from the second cover, the sixth protrusion portion defines a sixth opening, the seventh protrusion portion defines a seventh opening; the fourth protrusion block is fixed in the sixth opening, and the fifth protrusion block is fixed in the seventh opening.

5. An electronic device, comprising:
a printed circuit board (PCB);
at least one socket mounted to the PCB;
at least one connector inserted into the at least one socket;
a first member mounted to the PCB;
a second member mounted to the PCB; and
a first cover for covering and pressing against the at least one connector, the first cover comprising a first end for being fixed to the first member and a second end opposite to the first end for being fixed to the second member;
wherein:
at least one of the first member and the second member is soldered to the PCB, a first protrusion portion extends from the first end, the first protrusion portion defines a first through hole, the first member is mounted to the PCB via the first through hole;
the second member comprises a second base plate soldered to the PCB and a second plate extending from the second base plate, the second plate defines a second opening, the second plate comprises a first side plate, a second side plate, and a second connecting plate, the first side plate and the second side plate are respectively connected to two opposite ends of the second connecting plate, the first side plate and the second base plate are separated by the second opening, the second connecting plate and the second base plate are respectively connected to two opposite ends of the second side plate; and a clamping portion extends from the second end and defines a groove, the clamping portion is received in the second opening, and the second connecting plate is clamped to the groove.

6. The electronic device of claim 5, further comprising a third member, wherein the first cover further comprises a third end, the first end and the second end are respectively connected to two opposite ends of the third end, a third protrusion portion extends from the third end; and
the PCB comprises a first surface and a second surface opposite to the first surface, the at least one socket, the first member, and the second member are mounted to the first surface; the third member comprises a third base portion soldered to the second surface of the PCB, a third connecting plate, and a first pressing plate, the third base portion and the first pressing plate are respectively connected to two opposite ends of the third connecting plate, the first pressing plate is parallel to the third base portion, the first pressing plate presses against the third protrusion portion.

7. The electronic device of claim 6, wherein the first cover further comprises a fourth end opposite to the third end, the first end and the second end are respectively connected to two opposite ends of the fourth end, a fourth protrusion portion extends from the fourth end; and
a second pressing plate extends from the second cover, the second pressing plate presses against the fourth protrusion portion.

8. The electronic device of claim 6, wherein the first protrusion portion comprises a first plate and a first connecting plate, the first end and the first plate are respectively connected to two opposite ends of the first connecting plate, the first end and the first plate are respectively located in two opposite sides of the first connecting plate, and the first plate defines a first through hole.

9. The electronic device of claim 6, wherein the first end and the first plate are respectively and perpendicularly connected to two opposite ends of the first connecting plate.

10. The electronic device of claim 5, further comprising:
an integrated circuit mounted to the PCB; and
a second cover for covering the integrated circuit and providing an electro-magnetic interference (EMI) shield for the integrated circuit;
wherein a first distal end and a second distal end of the second cover are all soldered to the PCB, the second distal end is opposite to the first distal end; the second cover engages with the first cover and presses against the first cover.

11. A securing mechanism for securing at least one connector to at least one socket mounted to a printed circuit board (PCB), the at least one connector being inserted into the at least one socket; the securing mechanism comprising:
a first member mounted to the PCB;
a second member mounted to the PCB;
a first cover for covering and pressing against the at least one connector, the first cover comprising a first end for being fixed to the first member and a second end opposite to the first end for being fixed to the second member;
wherein at least one of the first member and the second member is soldered to the PCB, a first protrusion portion extends from the first end, a second protrusion portion extends from the second end; the first member comprises a first base portion soldered to the PCB and a first plate extending from the first base portion, the first base portion defines a groove, and the first protrusion portion is fixed in the groove; the PCB defines a first hole, and the first plate is fixed in the first hole; the second member comprises a base portion soldered to the PCB and a second plate extending from the base portion, the second plate defines a first opening, and the second protrusion portion is fixed in the first opening.

12. The securing mechanism of claim 11, further comprising:
a second cover, wherein a first distal end and a second distal end of the second cover are all soldered to the PCB, the second distal end is opposite to the first distal end;
the second cover is configured for covering an integrated circuit mounted to the PCB and providing an electromagnetic interference (EMI) shield for the integrated circuit; the second cover engages with the first cover and presses against the first cover.

13. The securing mechanism of claim 11, wherein a first protrusion portion extends from the first end, a second protrusion portion extends from the second end; the first member comprises a first base portion soldered to the PCB and a first plate extending from the first base portion, the first base portion defines a groove, and the first protrusion portion is fixed in the groove; the PCB defines a first hole, and the first plate is fixed in the first hole; and the second member comprises a base portion soldered to the PCB and a second plate extending from the base portion, the second plate defines a first opening, and the second protrusion portion is fixed in the first opening.

14. The securing mechanism of claim 13, wherein the first cover further comprises a third end connected to the first end and the second end, a third protrusion portion and at least one fourth protrusion portion extend from the third end, the third protrusion portion forms a first protrusion block; the second cover defines a second opening, and at least one fifth protrusion portion extends from the second cover, the first protrusion block is fixed in the second opening, the at least one fifth protrusion portion presses against the at least one fourth protrusion portion.

15. The securing mechanism of claim 13, wherein the first protrusion portion extends downwards from the first end, and the first protrusion portion is perpendicular to the first end; the second protrusion portion extends downwards from the second end, and the second protrusion portion is perpendicular to the second end.

* * * * *